United States Patent Office 3,231,378

Patented Jan. 25, 1966

3,231,378

IMAGE ENHANCEMENT IN PHOTOSENSITIVE COMPOSITIONS FOR PLANOGRAPHIC PRINTING PLATES

Julius L. Silver, Somerset, N.J., assignor to Union Carbide Corporation, a corporation of New York No Drawing. Filed July 10, 1963, Ser. No. 294,201
20 Claims. (Cl. 96—33)

The present invention relates to improved planographic printing plate compositions. More particularly the present invention relates to photosensitive resin compositions useful for the preparation of planographic printing plates which exhibit enhanced "image" formation.

In photographic type printing plates there are two types of images which can be formed. The latent or printing image is that image which will accept or reject printing ink and which may or may not be visible prior to printing. The second type of image which can be produced is the photographic or visible image. The visible image may have no attraction or repulsion toward the printing ink and as a result may not represent a printing surface. Both types of image are important to the printer. The latent or printing image determines the character of the reproduced material. A visible image allows him to determine the progress of the plate during exposure and allows him to easily align the plate.

Planographic printing plates comprising:

(1) A phenolic resin
(2) An ethylene oxide polymer
(3) A photosensitizing agent have been found to possess advantages hitherto unobtainable from other types of printing plates, especially in the field of planographic printing. In these printing plates an association product resin is formed from the admixture of the phenolic resin and the ethylene oxide polymer resin. This association product is formed into a film or sheet which serves as the printing plate base. The plate can be conveniently photo-sensitized in one of two ways. A suitable photosensitizer can be incorporated into the plate resin composition before the film is formed or it can be coated on the surface of the plate in solution. The photosensitizers which can be used include the diazo type sensitizers, the chromate type sensitizers and the halogen containing sensitizers.

All of these sensitizers produce excellent latent printing images after exposure to actinic light for a sufficient period of time, but photoresponse is relatively low. Very high photoresponse has not heretofore been possible. All of these photosensitizers produce visible images upon exposure to actinic light, but the halogen containing sensitizers produce only weak, faintly visible images.

The formation of a strong visible image on the printing plate is a highly desirable feature, since it enables the printer to determine the characteristics of the latent image or "printing image" prior to actual printing. The inability of a given sensitizer to produce a strong visible image therefore restricts its use. In the case of the halogenated aliphatic hydrocarbons this restriction is unfortunate for these photosensitizing agents produce otherwise excellent printing plates and are preferred over other types as sensitizers for the phenolic resin/ethylene oxide resin printing plates.

In accordance with the present invention it has been found that the visible image of phenolic resin/ethylene oxide polymer resin printing plates sensitized by halogenated aliphatic hydrocarbons can be greatly enhanced and strengthened by coating the surface of said printing plates with a suitable photosensitive organic dye before exposure to actinic light and that the visible image and photoresponse of the plate's latent image can be greatly increased by the incorporation of anthracene in the printing plate composition or halogenated hydrocarbon sensitizing solution. Anthracene can be represented by the chemical formula:

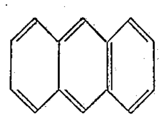

Photosensitive organic dyes which have been found to be suitable for use in the present invention are:

Halogenated derivatives of fluorescein, i.e.

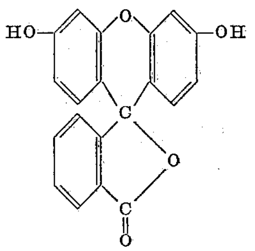

such as erythrosine (tetraiodofluorescein), eosine (tetrabromofluorescein), Rose Bengal (diiodoeosine), Phloxine (tetrabromodichlorofluorescein), and the like;

Cyanine type dyes, i.e., those containing the structure

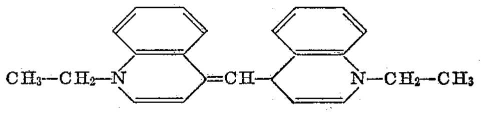

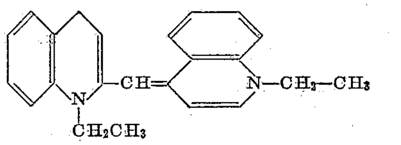

or

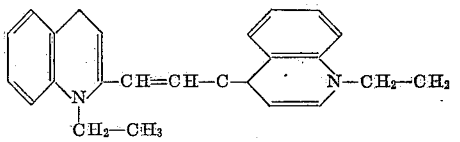

Carbocyanines (2,2',2,4' or 4,4') such as cyanine blue (1,1'diethyl-4,4'cyanine iodide), ethyl red (1,1'diethyl-2,4 cyanine iodide), pinacyanol (1,1'diethyl 2,2'carbocyanine iodide), Kryptocyanine (1,1'diethyl 4,4'carbocyanine iodide) and the like; and individual organic photosensitive dyes such as Rhodamine B (tetraethyl Rhodamine) methyl orange (sodium p-dimethylamine-azobenzenesulfonate), Alizarin Red S (hydroxy anthraquinone sulfonic acid) and the like.

It is interesting to note that the halogenated fluorescein dyes when used in the presence of halogenated aliphatic photosensitizers bleach out, upon exposure to actinic light, forming a negative image. The cyanine type dyes and the individual dyes listed above however, darken upon exposure to form a positive image. None of these dyes alone without the photosensitizer will form a visible image on the plate or a latent printing image.

By the term halogenated aliphatic photosensitizing agents is meant those halogenated alkyls of from 1 to 5 carbon atoms inclusive which when present in a phenolic resin/ethylene oxide resin plate and are exposed to actinic light, cause the exposed areas of the plate to become more oleophilic. Such photosensitizers are generally limited to those halogen substituents having atomic weights higher than 40, i.e., bromine and iodine or those of which have at least one bromine or iodine substituent.

These halogenated aliphatic photosensitizing agents can be substituted by electron donating substituents such as hydroxyl groups, provided said substituents are non-reactive in respect to the components of the composition.

Illustrative of such halogenated alkyl photosensitizing agents are bromomethane, dibromomethane, fromoform, iodomethane, diiodomethane, iodoform, carbon tetraiodide, 1,1-dibromoethane, 1,1,1-tribromomethane, tetrabromethane, 2-chloro-1,1,-triiodoethane, 2,2,2-triiodoethanol, 2-hydroxy - 1,1 - dibromoethane, 2-hydroxy-1-iodoethane, bromopropane, 1,2-diiodopropane, 1,1- dibromo-2-iodopropane, 1,2,3-triiodopropane, 1,2,-diiodo-3-chloro propane, 1,1-dibromo-3-propanol, tert-butyl bromide, 1,1-diiodobutanol, tetrabromobutane, 1,1,1-triiodo-2-methyl-2-propanol, 1,1,1-tetrabromopentane, and the like.

The ethylene oxide polymer component of the compositions is selected from resinous ethylene oxide polymeric materials having an average molecular weight in the range of from about 50,000 to about 10,000,000, which are readily soluble in water. The trem "ethylene oxide polymers" refers to polymers possessing the repeating unit ($CH_2$—$CH_2O$—) as represented by the class of commercial Polyox resins; and the term is intended to include water soluble ethylene oxide polymer resins wherein ethylene oxide is the predominant monomer polymerized therein but which can also contain polymerized residues of other olefin oxides as exemplified by copolymers and terpolymers of ethylene oxide with other copolymerizable monomers containing single epoxide groups such as propylene oxide, butylene oxide, styrene oxide and the like. Poly(ethylene oxide) homopolymer is however preferred as the ethylene oxide polymer resin and shall be used hereinafter as represenattive of these resins.

The phenolic resin component of the compositions of the present invention are the heat fusible condensation products of a phenol with an aldehyde. Such condensation products are divided into two classes, resoles and novolaks, either of which can be used in this invention as is shown hereinafter. These two types of resins are discussed in order below. Both of these classes of phenolic resins will form in association with ethylene oxide polymers, and a suitable photosensitizing compound, a photosensitive composition and when placed on a support as a thin film and cured, will comprise a planographic printing plate suitable for reproduction in continuous tone for large number of faithfully detailed copies.

While these phenolic resins are in the fusible form when making the association product (as hereinafter more clearly set forth) the fusible condition is not necessarily a critical condition of the association product, in which it is possible for a portion or all of the phenolic resin component to be fully advanced to the cured state.

The fusible resole phenolic resins can advance upon heating to a degree of cure and polymerization to attain a completely insoluble state. These insoluble phenolics cannot be used in the preparation of the present compositions but are believed to be present in the cured printing plate compositions of this invention. In the preparation of the present compositions only those heat fusible phenolic resins which are soluble in water, alkali or organic solvents such as acetone, ethanol and the like and which are sufficiently fusible to permit admixture and association with the ethylene oxide polymers can be used. These resins include those resole phenolic resins which have not cured to a degree of insolubility as well as the novolak resins discussed below.

RESOLE RESINS

Resole resins, are produced by the condensation of phenols and aldehydes under alkaline conditions. Resoles differ from novolaks in that polynuclear methylol-substituted phenols are formed as intermediates in resoles. A resole produced by the condensation of phenol with formaldehyde most likely proceeds through an intermediate having the following illustrated type structure:

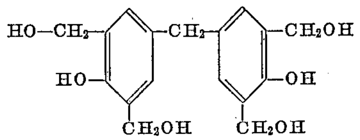

In a typical synthesis, resoles are prepared by heating one mole of phenol with 1.5 moles of formaldehyde under alkaline conditions.

The resole resins are prepared by the condensation of phenol with formaldehyde or, more generally, by the reaction of a phenolic compound, having two or three reactive aromatic ring hydrogen positions, with an aldehyde or aldehyde-liberating compound capable of undergoing phenol-aldehyde condensation. Illustrative of phenolic compounds are cresol, xylenol, ethylphenol, butylphenol, isopropylmethoxyphenol, chlorophenol, resorcinol, hydroquinone, naphthol, 2,2-bis(p-hydroxyphenyl)propane, and the like. Illustrative of aldehydes are formaldehyde, acetaldehyde, acrolein, crotonaldehyde, furfural, and the like. Illustrative of aldehyde-liberating compounds are for example, paraformaldehyde, formalin and 1,3,5-trioxane. Ketones such as acetone are also capable of condensing with the phenolic compounds, as are methylene engendering agents such as hexamethylenetetramine.

The condensation of phenolic compound and aldehyde is conducted in the presence of alkaline reagents such as sodium carbonate, sodium acetate, sodium hydroxide, ammonium hydroxide, and the like. When the condensation reaction is completed, if desired the water and other volatile materials can be removed by distillation, and the catalyst neutralized.

NOVOLAK RESINS

The novolak resins are prepared in a manner similar to that used to prepare the resole resins. The distinguishing exception in this preparation is however that the reaction is conducted in an acidic media, instead of an alkaline media as is the case with the resoles. When less than six moles of formaldehyde are used per seven moles of phenol the products are permanently fusible and soluble. These are the novolak resins. The novolaks have a different structure than the resoles as is illustrated by the novolak condensation products of phenol with formaldehyde:

(a)

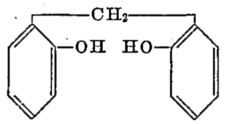

(b)

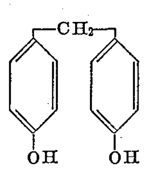

(b)

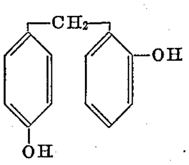

The novolaks can be further reacted with formaldehyde or with a methylol yielding compound such as hexamethylene tetramine, to a state of cure which is similar in the nature to the curing pattern of the resoles.

In a typical synthesis novolaks are prepared by heating one mole of phenol with 0.5 mole of formaldehyde under acidic conditions. The temperature at which the reaction is conducted is generally from about 25° C. to about 175° C.

The reactants which can be used in the preparation of the novolaks are the same as those used in the preparation of the resoles which are described and listed above.

While as previously stated both the resole resins and the novolak resins can be employed in the compositions of the present invention, it is preferred to use the resole resins, as printing plates formed from compositions utilizing them give sharper prints and have a longer printing life.

The most suitable fusible resole resins are those which are insoluble in water but readily soluble in conventional organic solvents such as methyl ethyl ketone, acetone, methanol, ethanol, and the like. Resole resins having a particularly desirable combination of properties are those which have an average molecular weight in the range between about three hundred fifty and six hundred. It is believed that these resole resins contain an average of at least one methylol group per aromatic nucleus.

The photosensitizer can be incorporated into the printing plate composition or applied to the surface of the plate by coating from solution in a solvent such as acetone.

The anthracene can also be either incorporated into the printing plate composition or coated on the surface of the plate. When the anthracene is incorporated, it is generally used in an amount of from 0.5 to 5 percent and preferably from 1 to 3 percent based upon weight of ethylene oxide polymer plus phenolic resin. When it is applied as solution it is generally applied in any concentration consistent with solubility but preferably from 10 to 50 percent by weight based upon weight of sensitizer.

The photosensitive image forming organic dye can likewise be incorporated into the printing plate composition or coated on the surface of the plate.

When the photosensitizing agent is incorporated into the plated it is generally used in an amount of from about $\frac{1}{20}$ to about $\frac{1}{3}$ part by weight based on the weight of the phenolic resin. When the photosensitizing agent is used as a coating it is generally used in a concentration from $\frac{1}{2}$ to 5 percent by weight of sensitizing solution.

The photosensitive dye is generally used in an amount of from $\frac{1}{20}$ to $\frac{1}{3}$ part by weight based on the weight of the sensitizer. When used as a coating it is generally used at a concentration of from $\frac{1}{20}$ to 1 percent based upon weight of poly(ethylene oxide) plus phenolic resin. It should be noted that the anthracene increases both the photoresponse of the plate and photosensitive dye and that the latent effect is not dependent upon the presence of that dye. That is, anthracene can be used without the dye to increase the photoresponse of the latent printing image. Similarly the photosensitive dye can be used without the anthracene if very high photoresponse of the visible and latent images is not desired.

When the plates are photosensitized by solution coating the sensitizer on the plate, it has been found desirable to similarly solution coat the anthracene and the photosensitive dye. While these coatings are preferably accomplished simultaneously from a mixed solution, they can be applied as separate coatings.

Suitable solvents for the photosensitive dyes and anthracene include acetone, acetone/water mixtures, and lower alcohols.

While applicant does not intend to be bound by theory, it should be said that it is believed that anthracene increases the photoresponse of the plates and the photosensitive dye by the effect of high Stokes fluorescence. That is the anthracene is excited by light radiation and emits radiation of a different frequency which has a greater effect on the photosensitive plate and dye.

*Example 1*

FLUORESCEIN TYPE DYES AS IMAGE PRODUCERS

A phenolic resin was prepared by refluxing a mixture of 100 parts by weight with meta cresol with 100 parts by weight of 37 percent formalin and 3 parts by weight of sodium hydroxide for a period of two hours at a temperature of 80° C. and a pressure of 13 inches of mercury. The reacted mixture was neutralized with a boric acid until a pH of from about 3.5 to about 3.8 had been attained i.e. about 1.3 parts of boric acid. The adjusted material was then dehydrated at a pressure of about 8 inches of mercury until the temperature reached 95° C. The dehydrated residue was then discharged from the still, cooled, and ground to a powder.

This resin was used to prepare a printing plate material by milling together 30 parts of poly(ethylene oxide) having a molecular weight of 4–8 million, 20 parts of the above resole phenolic resin, 30 parts of water and 5 parts of oxalic acid until a homogeneous material was obtained. The plate was pressed out on a paper substrate at a temperature of 130° C. under a pressure of about 300 pounds per square inch for about one minute.

This plate was coated by wiping with an acetone solution containing 5 percent iodoform and 1 percent tetraiodofluoroescein. After exposure to a 15 ampere carbon arc placed at a distance of 24" from the plate for a period of 5 minutes, the plate developed a strong visible image. The non-image areas were red and the image areas were yellow.

In a similar manner the following organic photosensitive dyes were evaluated:

Erythrosine
Rose Bengal
Phloxin

All were found to produce excellent bleach out images on the same plates using iodoform as in Example I.

*Example 2*

CYANINE TYPE DYES AS IMAGE FORMERS

Thirty grams of poly(ethylene oxide) was made into a paste with 200 milliliters of water. This was milled on a two-roll mill the rolls of which were set at temperatures of 100° C. and 90° C., respectively, until a good sheet was formed. A phenolic resin was previously prepared by refluxing 100 parts by weight of m-cresol, 285 parts by weight of 37 percent formalin and 43 parts by weight sodium acetate in 300 parts by weight water until a precipitate formed. This precipitate was then removed and washed with water. Fifty grams of this m-cresol-formaldehyde resin was added to the poly(ethylene oxide) resin on the two roll mill and the mixture was washed until a homogeneous produce was produced. Three grams of iodoform in acetone solution was then added to the material on the mill. This was followed by a water slurry of 3 grams of oxalic acid and an alcohol solution of 0.3 gram of ethyl red dye in 25 cubic centimeters of ethanol. The milling was continued until a uniform sheet was formed. The material was pressed on a sheet of flexible cardboard under a pressure of 300 pounds per square inch at a temperature of 130° C. for a period of one minute. The plate was covered with a photographic continuous-tone negative and exposed for 5 minutes to a 15 ampere carbon arc lamp placed at a distance of 2 feet. The plate showed a clear sharp image after exposure.

In a manner identical to Example 2 above pinacyanol dye (1,1,'-diethyl-2-2'-carboxyaniline iodide) was used in place of ethyl red. Excellent visible image resulted.

*Example 3*

CYANINE TYPE DYES AS IMAGE FORMERS

Example 2 was repeated except that neither iodoform nor ethyl red was added while milling. The finished plate was coated with an acetone solution which was 10 percent iodoform and 0.5 percent ethyl red. The visible image formed during exposure.

In a similar manner printing plate compositions are prepared in which the following photosensitive dyes are used to produce visible image.

Rhodamine B
Methyl Orange
Alizarin Red S

*Example 4*

A phenolic resin-ethylene oxide resin printing plate as prepared in Example 1 above was coated with an acetone solution containing 5 percent idoform and 1 percent Rhodamine B dye. The coating was permitted to dry, a neagtive was placed over the plate and it was exposed to a 15 ampere carbon arc placed at a distance of 24 inches from the plate for a period of 5 minutes.

After exposure the plate showed a sharp visible image.

*Example 5*

A phenolic resin-ethylene oxide resin printing plate was prepared in the same manner as Example 1 above. The plate was coated with an acetone solution containing 5 percent iodoform and 1 percent of methyl orange. The plate was covered with a negative and exposed to a 15 ampere carbon arc for a period of 5 minutes. A clear, sharp image was produced.

*Example 6*

Example 5 was repeated exactly except that Alizarin Red S was substituted for the methyl orange dye. The plate was exposed in a similar manner. This plate also produced a clear, sharp visible image.

*Example 7*

Twenty parts of the powdered resole phenolic resin prepared in Example 1 was milled on a two roll mill with 30 parts of poly(ethylene oxide) having a molecular weight of 8,000,000, 30 parts of water, 3 parts of anthracene, 5 parts of iodoform and 3 parts of oxalic acid until a homogeneous material was obtained. The plate was pressed out on a paper substrate at a temperature of 130° C. under a pressure of about 300 pounds per square inch for about one minute.

This plate was then covered with a photographic negative and exposed to a 15 ampere carbon arc placed at a distance of 24 inches from the plate for a period of one minute. The plate was then rinsed in water and placed on an offset printing plate. The prints from this plate were excellent in all respects. This clearly demonstrates the increase in photoresponse obtained through the use of anthracene.

*Example 8*

In a manner identical to that described in Example 7 a printing plate was prepared except that ⅓ part tetraiodofluorescein was added to the plate composition during milling. The plate was exposed under the same conditions as described in Example 7. After an exposure period of one minute the plate had developed a strong yellow image area. The non-image areas were red. This plate was rinsed in water and mounted on an offset printing press. Excellent prints were obtained. This example demonstrates the simultaneous increase in speed of latent and visible image formation through the use of anthracene and photosensitive dye.

In a similar manner increase in dye photoresponse is demonstrated using the following dyes:

| | |
|---|---|
| Erthrosine | Ethyl Red |
| Rose Bengal | Pinacyanol |
| Phloxin | Rhodamine B |
| Pinacyanol | Methyl Orange |
| | Alizarin Red S |

*Example 9*

In a maner similar to Example 1 a planographic printing plate was prepared except that an acid catalyzed phenolic resin (novolak resin) was used. This resin was prepared as described in Example 1 except that 3 parts of hydrochloric acid were used to catalze the reaction in place of the 3 parts of sodium hydroxide. This plate was then uniformly coated with an acetone-water solution containing 5 percent iodoform and 2 percent anthracene, all percentages by weight. This plate shall be referred to as plate A.

An identical plate was unformly coated with an acetone water solution of 3 percent iodoform, 1 percent anthracene and $\frac{1}{10}$ percent ethyl red, all percentages by weight. This plate shall be referred to as plate B. The coatings were allowed to dry and then the plates were covered with a photographic negative. The covered plates were then placed 24 inches from a 15 ampere carbon arc light source and exposed for a period of 3 minutes. At the end of this time plate A showed a faint yellow image. Plate B, however, exhibited a clear sharp visible image. Both plates were rinsed in water and mounted in turn on an offset printing press. Both plates produced excellent prints.

What is claimed is:

1. A photosensitive composition comprising an ethylene oxide polymer resin having an average molecular weight of from about 50,000 to about 10,000,000 (2) a phenolic resin, (3) a halogenated aliphatic photosensitizing agent containing from 1 to 5 carbon atoms inclusive wherein said halogen has an atomic weight greater than 40 which upon exposure to light energy causes said photosensitive composition to become more oleophilic in areas of exposure, and (4) a member of the group consisting of anthracene, an organic dye, photosensitive in the presence of said photosensitizing agent and a mixture of anthracene and said photosensitive organic dye.

2. A photosensitive composition comprising an ethylene oxide polymer resin having an average molecular weight of from about 50,000 to about 10,000,000, (2) a phenolic resin, (3) a halogenated aliphatic photosensitizing agent containing from 1 to 5 carbon atoms, wherein said halogen has an atomic weight greater than 40 which upon exposure to light energy causes said photosensitive composition to become more oleophilic in areas of exposure, and (4) anthracene.

3. A photosensitive composition comprising an ethylene oxide polymer resin having an average molecular weight of from about 50,000 to about 10,000,000, (2) a phenolic resin, (3) a halogenated aliphatic photosensitizing agent containing from 1 to 5 carbon atoms wherein said halogen has an atomic weight greater than 40 which upon exposure to light energy causes said photosensitive composition to become more oleophilic in areas of exposure, and (4) an organic dye, photosensitive in the presence of said photosensitizing agent.

4. A photosensitive composition comprising an ethylene oxide polymer resin having an average molecular weight of from about 50,000 to about 10,000,000 (2) a phenolic resin, (3) a halogenated aliphatic photosensitizing agent containing from 1 to 5 carbon atoms wherein said halogen has an atomic weight greater than 40 which upon exposure to light energy causes said photosensitive composition to become more oleophilic in areas of exposure, and (4) a mixture of anthracene and an organic dye, photosensitive in the presence of said photosensitizing agent.

5. The photosensitive composition of claim 1 wherein said photosensitive dye is a halogenated fluorescent type dye.

6. The photosensitive composition of claim 1 wherein said photosensitive dye is a cyanine type dye.

7. The photosensitive composition of claim 1 wherein said photosensitive dye is Rhodamine B.

8. The photosensitive composition of claim 1 wherein said photosensitive dye is Alizarin Red S.

9. The photosensitive composition of claim 1 wherein said photosensitive dye is methyl orange.

10. The photosensitive composition of claim 3 wherein said photosensitive dye is erythrosine.

11. The photosensitive composition of claim 3 wherein said photosensitive dye is eosine.

12. The photosensitive composition of claim 3 wherein said photosensitive dye is rose bengal.

13. The photosensitive composition of claim 3 wherein said photosensitive dye is phloxine.

14. The photosensitive composition of claim 4 wherein the photosensitive dye is ethyl red.

15. The photosensitive composition of claim 4 wherein the photosensitive dye is pinacyanol.

16. The photosensitive composition of claim 1 wherein said photosensitizing agent is iodoform.

17. The method of imparting enhanced image formation to a ethylene oxide polymer/phenolic resin planographic printing plate sensitized with a halogenated aliphatic sensitizing agent containing from 1 to 5 carbon atoms inclusive wherein said halogen has an atomic weight greater than 40, which upon exposure to light energy causes said printing plate to become more oleophilic in areas of exposure by imparting to the plate surface a member selected from the group consisting of anthracene, an organic dye, photosensitive in the presence of said photosensitizing agent, and a combination of anthracene and said photosensitive organic dye, wherein said ethylene oxide polymer has a molecular weight of from about 50,000 to about 10,000,000.

18. The method imparting enhanced image formation to a ethylene oxide polymer/phenolic resin planographic printing plate sensitized with a halogenated aliphatic sensitizing agent containing from 1 to 5 carbon atoms inclusive wherein said halogen has an atomic weight greater than 40, which upon exposure to light energy causes said printing plate to become more oleophilic in areas of exposure by coating the plate surface with a solution of anthracene, wherein said ethylene oxide polymer has a molecular weight of from about 50,000 to about 10,000,000.

19. The method of imparting enhanced image formation to a ethylene oxide polymer-phenolic resin planographic printing plate sensitized with a halogenated aliphatic sensitizing agent containing from 1 to 5 carbon atoms inclusive wherein said halogen has an atomic weight greater than 40, which upon exposure to light energy causes said printing plate to become more oleophilic in areas of exposure by coating the plate surface with a solution of an organic dye, photosensitive in the presence of said photosensitizing agent, wherein said ethylene oxide polymer has a molecular weight of from about 50,000 to about 10,000,000.

20. The method of imparting enhanced image formation to a ethylene oxide polymer-phenolic resin planographic printing plate sensitized with a halogenated aliphatic sensitizing agent containing from 1 to 5 carbon atoms inclusive wherein said halogen has an atomic weight greater than 40, which upon exposure to light energy causes said printing plate to become more oleophilic in areas of exposure by coating the plate surface with a solution of a combination of anthracene and an organic dye, photosensitive in the presence of said photosensitizing agent, wherein said ethylene oxide polymer has a molecular weight of from about 50,000 to about 10,000,000.

References Cited by the Examiner

UNITED STATES PATENTS

| | | | |
|---|---|---|---|
| 1,574,357 | 2/1926 | Beebe et al. | 96—115 X |
| 1,587,270 | 6/1926 | Beebe et al. | 96—115 |
| 1,655,127 | 1/1928 | Beebe | 96—115 X |
| 2,980,535 | 4/1961 | Schroeter | 96—115 X |
| 3,100,703 | 8/1963 | Sprague et al. | 96—90 X |
| 3,112,200 | 11/1963 | Wainer | 96—90 |

FOREIGN PATENTS

| | | |
|---|---|---|
| 530,182 | 9/1956 | Canada. |
| 921,530 | 3/1963 | Great Britain. |

NORMAN G. TORCHIN, *Primary Examiner*.